(12) United States Patent
Nakao et al.

(10) Patent No.: US 6,262,577 B1
(45) Date of Patent: Jul. 17, 2001

(54) METHOD OF MEASURING QUANTITIES INDICATING STATE OF ELECTROCHEMICAL DEVICE AND APPARATUS FOR THE SAME

(75) Inventors: Taketoshi Nakao, Kyoto; Masaya Ugaji; Kenichi Takeyama, both of Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/397,923

(22) Filed: Sep. 17, 1999

(30) Foreign Application Priority Data

Sep. 18, 1998 (JP) ................................... 10-265546
Sep. 18, 1998 (JP) ................................... 10-265547

(51) Int. Cl.$^7$ ................................................. H01M 10/46
(52) U.S. Cl. ........................... 324/425; 324/427; 703/13; 320/135
(58) Field of Search ................................. 324/425, 426, 324/427; 703/13; 320/135

(56) References Cited

U.S. PATENT DOCUMENTS

| | | | |
|---|---|---|---|
| 4,881,037 | * 11/1989 | Bellingham et al. | 324/425 |
| 5,270,659 | * 12/1993 | Toyoda et al. | 324/425 |
| 5,278,509 | * 1/1994 | Haynes et al. | 324/426 |
| 5,349,540 | 9/1994 | Birkle et al. | 703/13 |
| 5,424,722 | * 6/1995 | Imada et al. | 324/426 |
| 5,479,085 | * 12/1995 | Honda et al. | 324/425 |
| 5,512,831 | * 4/1996 | Cisar et al. | 324/425 |
| 5,596,260 | 1/1997 | Moravec et al. | 320/135 |
| 5,933,010 | * 8/1999 | Moreno | 324/425 |

FOREIGN PATENT DOCUMENTS 29620628   7/1997   (DE).

* cited by examiner

Primary Examiner—Peter S. Wong
Assistant Examiner—Pia Tibbits
(74) Attorney, Agent, or Firm—Wenderoth, Lind & Ponack, L.L.P.

(57) ABSTRACT

A method of measuring quantities that indicates the state of an electrochemical device having an electrode and an ionic conductor, such as material properties or a residual capacity, without disassembling the device. The quantities are measured by comparing (a) a series of theoretical data of an electrical characteristic of the device obtained by combining at least one of an electron transportation model of the electrode, an ion transportation model of the electrode, an ion conduction model of the ionic conductor and a model of an electrochemical reaction taking place in an interface between the electrode and the ionic conductor, with a potential model of the electrode, with (b) a series of measured data of the electrical characteristic of the electrochemical device.

12 Claims, 9 Drawing Sheets

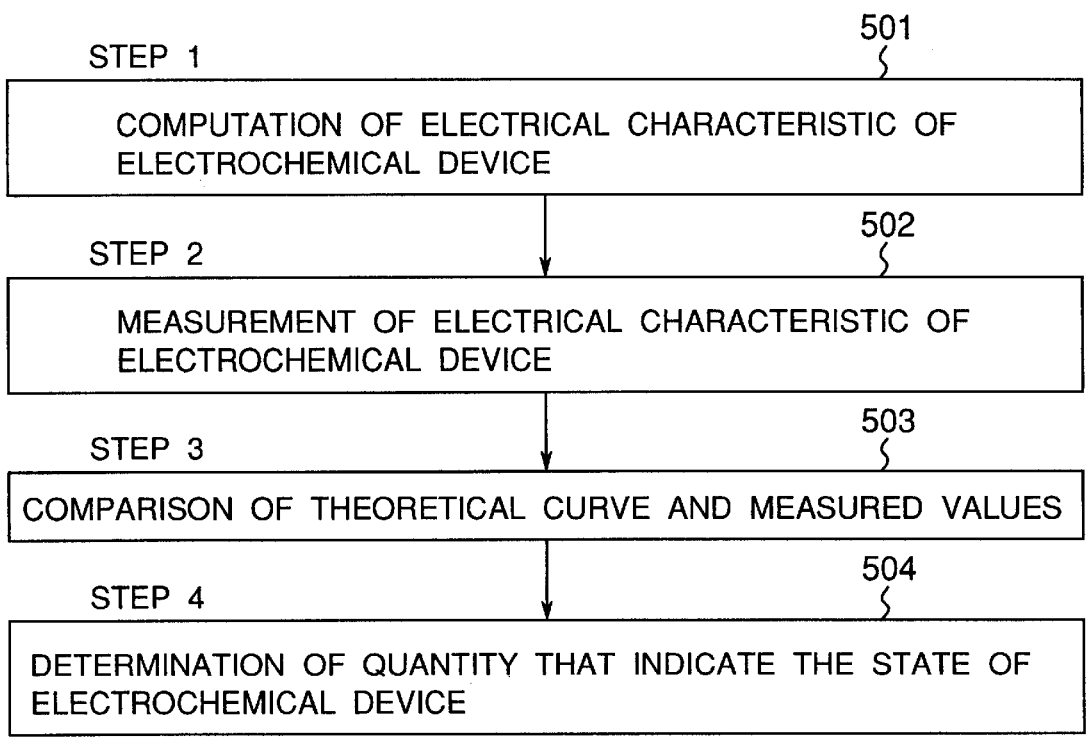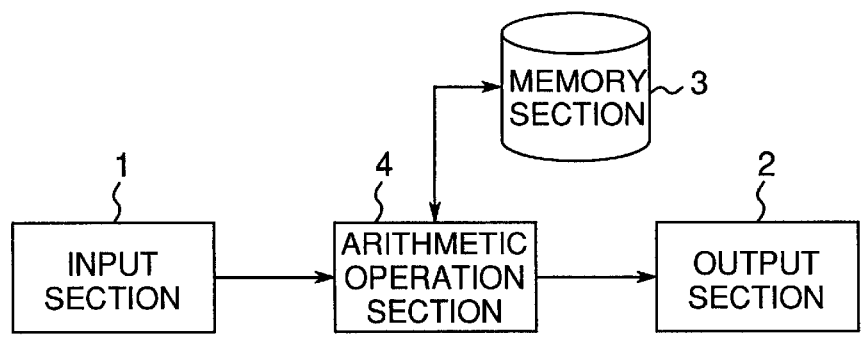

METHOD OF MEASURING QUANTITIES INDICATING STATE OF ELECTROCHEMICAL DEVICE AND APPARATUS FOR THE SAME

BACKGROUND OF THE INVENTION

The present invention relates to a method of measuring quantities that indicate the state of an electrochemical device and an apparatus for the same. More particularly, this invention relates to a method of measuring (a) properties of battery materials in initial state or in degraded state and (b) remaining charge/discharge capacity of the battery.

Electrochemical devices such as batteries, capacitors and electrochromic devices are widely used in electric and electronic apparatuses. Recently, in particular, batteries are attracting much attention. Because mobile electronics apparatuses such as notebook computers or video camcorders become popular, and energy consumption and the public concern about the environmental issues has increased.

While there are diverse types of batteries, they are classified into two categories: One is the primary battery that is not rechargeable and another is the secondary battery that is rechargeable.

Representative of the primary battery is alkali battery. There are also Leclanche battery, lithium battery, zinc-air battery and other types. The secondary batteries include lithium ion secondary battery, nickel-hydrogen battery, nickel-cadmium battery, lead-acid battery and fuel cell. Lithium ion secondary battery has been finding increasingly wider applications in recent years. Nickel-hydrogen storage battery is used for large-capacity power supply such as in electric automobiles.

In addition, there are physical cells such as solar cell and thermal battery.

Incessant research efforts have been made to develop new batteries or new component materials for batteries in order to improve storage capacity, energy density and cycle performance.

A work for the research and development of battery component materials is, for example, carried out as follows. First, promising materials to make high-capacity electrodes are synthesized. Electrochemical characteristics of a single electrode in an open cell made of these materials are measured, to evaluate the performance of these materials. Then a battery is built with materials having better characteristics for a positive or a negative electrode, and performance of this battery is measured in a laboratory test. At the same time, characteristics of materials to make other battery components such as an electrolyte and a separator are also examined. Using the materials that have been selected, a battery is built to evaluate the battery performance.

When the battery is used for an extended period of time, constituent materials of the battery degrade over time. Thus, it becomes necessary to analyze the state of the cell materials. Analysis of degraded battery materials has been previously done in such a procedure as shown in FIG. 14. First, the degraded battery is disassembled (step 501), and physical or physicochemical parameters of the constituent materials such as electrodes, electrolyte and the separator are measured (step 502), thereby to determine the properties of the constituent materials (step 503). Then, By comparing the determined properties with that of the materials, before assembled into the battery (step 504), degradation of the materials can be determined.

However, many of the steps in these measurements require skills and take time as long as several hours to several days.

Other measurement methods of degree of degradation of the battery are as follows:

(1) Measurement of internal impedance of the battery (Japanese Patent Publication (Laid-Open) Nos. 53-42327 and 61-170678)

(2) Measurement of internal impedance of the battery by means of signals of different frequencies and processing of the measured values with a given equation (Japanese Patent Publication (Laid-Open) Nos. 8-43506 and 8-250159)

(3) Measurement of electrical resistance of an active material that is a constituent element of the battery (Japanese Patent Publication (Laid-Open) No. 56-103875)

(4) Comparison of voltage measured after discharging current for a predetermined period of time to a predetermined reference value (Japanese Patent Publication (Laid-Open) Nos. 59-48661, 3-95872, 8-254573, 8-55642 and 9-33620)

(5) Counting the number of charge/discharge cycles (Japanese Patent Publication (Laid-Open) Nos. 5-74501 and 6-20724)

However, these methods of measuring the degree of degradation of the battery are low in accuracy. The measurement accuracy becomes especially low after storage at a high temperature or repeated discharge/charge cycles.

It is also important to correctly measure the remaining capacity of the battery to increase the rate of the battery energy utilization. For example, sensing the full-charge state of a secondary battery is important to prevent overcharging of the battery in quick charging. Variety of measurement methods have begun to be widely used for primary batteries, secondary batteries and secondary battery chargers.

The following methods have been proposed for measuring the remaining capacity of batteries.

(1) Measurement of change in specific gravity of the electrolyte (2) Integration of actual output current and input current (Current integration method)

(3) Measurement of battery voltage under unloaded condition (4) Measurement of battery voltage under loaded condition Full-charged state of a secondary battery during quick charging is sensed by the following methods.

(1) Measurement of voltage drop of the battery when overcharged: Detection of full charge by $\Delta V$ (2) Detection of heat generated during overcharging with a thermistor, and detection of full-charge state by the value of $dT/dt$ However, measuring accuracy of these methods are low, especially after storage at a high temperature or repeated charge-discharge cycles.

An object of the present invention is to provide a method of and an apparatus for accurately measuring the material properties or remaining capacity of the electrochemical device without disassembling.

SUMMARY OF THE INVENTION

The present invention provides a method of measuring quantities that indicate the state of an electrochemical device having electrodes and an ionic conductor by comparing (a) a series of theoretical data of an electrical characteristic obtained by combining at least one of an electron transportation model of the electrode, an ion transportation model of the electrode, an ion conduction model of the ionic conductor and a model of the electrochemical reaction taking place in the interface between the electrode and the ionic conductor, with a potential model of the electrode, with (b) a series of measured data of the electrical characteristic of the electrochemical device.

The present invention also provides an apparatus for measuring quantities that indicate the state of an electrochemical device having electrodes and an ionic conductor comprising:

(a) a memory section for storing a series of theoretical data of an electrical characteristic obtained by combining at least one of the electron transportation model of the electrode, the ion transportation model of the electrode, the ion conduction model of the ionic conductor and a model of the electrochemical reaction that takes place in the interface between the electrode and the ionic conductor, with the potential model of the electrode;

(b) an input section for entering a series of measured data of the electrical characteristic of the electrochemical device;

(c) an arithmetic operation section for comparing the theoretical data stored in the memory section with the measured data entered through the input section; and (d) an output section for giving an output of the result of arithmetic operation from the arithmetic operation section.

BRIEF DESCRIPTION OF THE DRAWINGS

FIG. 1 is a flow chart showing the measuring method of the present invention.

FIG. 2 is a block diagram showing the measuring apparatus of the present invention.

DETAILED DESCRIPTION OF THE PREFERRED EMBODIMENTS

Figure 3:
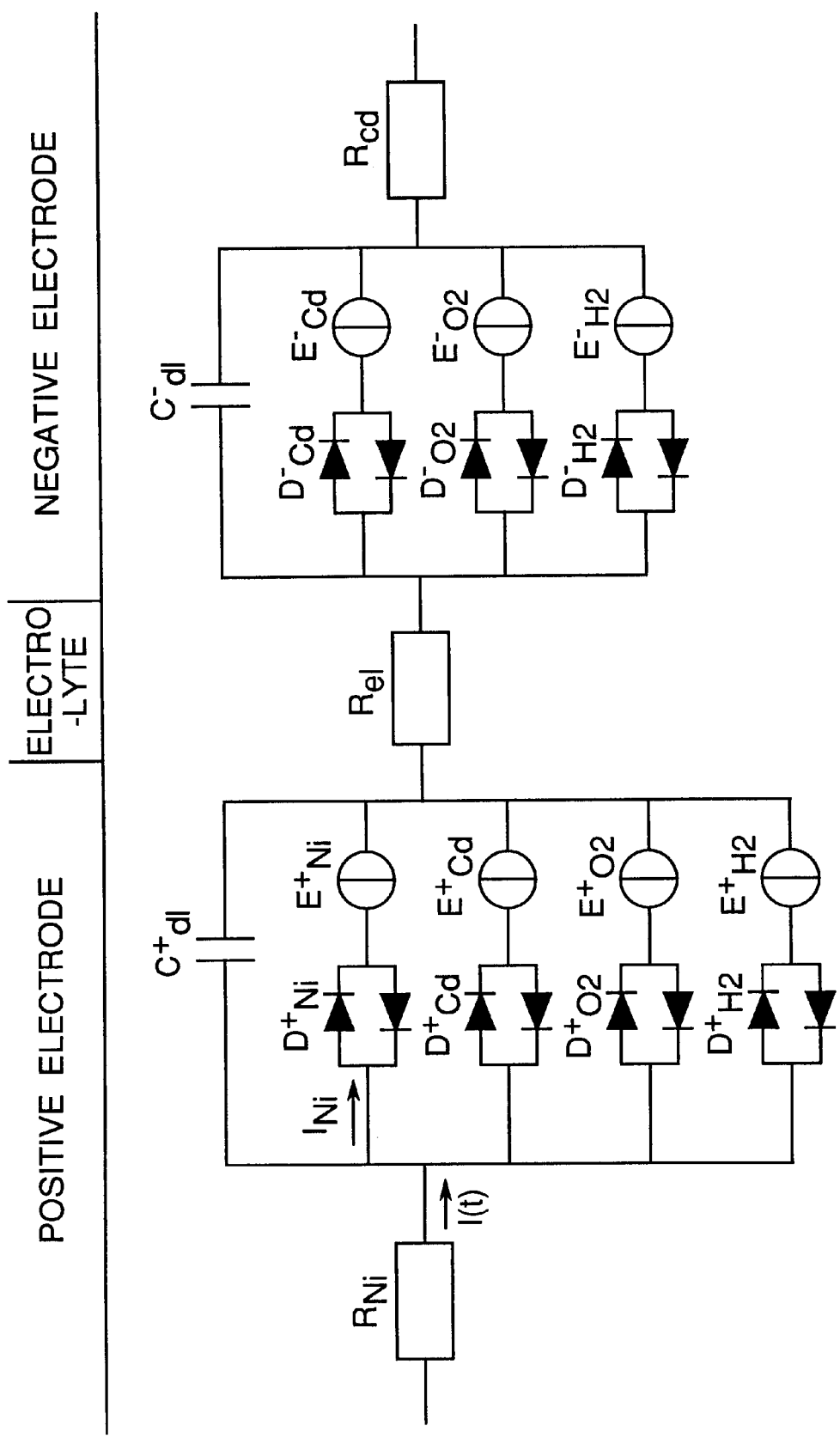
FIG. 3 is an equivalent circuit model representing the battery.

Referring to FIG. 1, the measurement method embodying the present invention is schematically shown in a flow chart.

First, a theoretical curve of an electrical characteristic of the electrochemical device is obtained by combining;

(i) at least one of an electron transportation model of the electrode, an ion transportation model of the electrode, an ion conduction model of the ionic conductor and a model of the electrochemical reaction taking place in the electrode-ionic-conductor interface; with (ii) the potential model of the electrode (step 1).

A measured curve of the electrical characteristic of the electrochemical device is obtained (step 2).

By comparing the theoretical curve with the measured curve (step 3), quantities indicating the state of the electrochemical device are determined (step 4).

According to the measurement method of the present invention, it is necessary to obtain the theoretical curve of the electrical characteristics of the electrochemical device that has electrodes and an ionic conductor. Now the theoretical curve of electrical characteristics will be described first. The electrode is, for example, a metal electrode, a gas electrode or a metallic-salt electrode. The ionic conductor is, for example, liquid or solid that shows ion conductivity.

The theoretical curve of electrical characteristics of the electrochemical device is obtained by combining;

(i) a model representing the polarizatioa potential under loaded condition obtained by using at least one of the electron transportation model of the electrode, the ion transportation model of the electrode, the ion conduction model of the ionic conductor and a model of the electrochemical reaction taking place in the interface between the electrode and the ionic conductor; with (ii) the potential model of the electrode under unloaded condition.

In this specification the term "electrochemical reaction" means both a principal reaction with free energy change of an active material and an electrochemical or chemical reaction that accompanies the principal reaction.

The potential model of the electrode under unloaded condition is generally equal to a potential model in equilibrium state. The electrochemical reaction in the electrode is expressed by equation (1), where Ox denotes a reacting material, n the number of reacting electrons, e the electron, and Red a product material. Unloaded electrode potential $E_{eq}$ is given by equation (2);

$$Ox + ne^- \leftrightarrow Red \tag{1}$$

$$E_{eq} = E_0 + \frac{RT}{nF} \ln \frac{[Ox]}{[Red]} \tag{2}$$

where $E_0$ represents the standard potential of the electrode, R is the gas constant, T is the temperature (absolute temperature) and F the Faraday constant. [Ox] and [Red] are activities of the reacting material and the product material, respectively. Among these quantities $E_0$, [Ox] and [Red] depend on the materials of the electrode. Temperature dependency of the standard potential $E_0$ is given by the following equation (3). The term $dE(T)/dT$ represents the temperature coefficient of the standard potential.

$$E^0(T) = E^0(T = 298) + \frac{dE(T)}{dT}(T - 298) \tag{3}$$

On the other hand, the polarization potential η under loaded condition is derived from a combination of the electron transportation model of the electrode, the ion transportation model of the electrode, the ion conduction model of the ionic conductor and the model of the electrochemical reaction taking place in the interface between the electrode and the ionic conductor. For example, the polarization potential η under load is given by the equation (4);

$$E - E_{eq} = \eta = i(R_{ohm} + R_{ct} + R_{mt}) \quad (4)$$

where E and i represent the working potential and current of the electrode under loaded condition. Rohm is sum of the electrode resistance and the ion-transportation resistance of the ionic conductor. The electrode resistance is derived from the electron transportation model of the electrode and is inversely proportional to the electron conductivity. The ion transportation resistance is derived from the ion transportation model and is inversely proportional to the ion conductivity (including the transport number). Electrical resistance of other components outside the battery such as leads and IC may also be included in $R_{ohm}$.

Reaction resistance $R_{ct}$ is derived from the model that represents the electrochemical reaction taking place in the interface between the electrodes and the ionic conductor. This model is generally expressed in the form of, for example, equation (5). The reaction resistance $R_{ct}$ is given by equation (6), which is an approximation of the equation (5).

$$i = i_0 \left\{ -\exp\left(-\frac{\alpha nF}{RT}\eta\right) + \exp\left(\frac{(1-\alpha)nF}{RT}\eta\right) \right\} \quad (5)$$

$$R_{ct} = \frac{RT}{nFi_0} \quad (6)$$

In equation (5) and (6), parameters $i_0$ and α are exchange current density and charge transfer coefficient of the electrochemical reaction, respectively. As can be seen from equation (6), the reaction resistance $R_{ct}$ is inversely proportional to the exchange current density $i_0$. Temperature dependency of the exchange current density $i_0$ is given by the following equation (7). The parameter $E_a$ represents the activation energy of the electrochemical reaction shown in the equation (1).

$$i_0(T) = i_0(T=293)\exp\left[\frac{E_a}{R}\left(\frac{1}{293} - \frac{1}{T}\right)\right] \quad (7)$$

$R_{mt}$ is the ion-transportation resistance of the electrode, and is derived from the ion transportation model of the electrode. The ion transportation model of the electrode is, for example, given by the following equation (8). $R_{mt}$ is derived from the equation (8) by the similar method used in deriving Rct;

$$i = i_0 \left\{ -\frac{[Ox(x=0)]}{[Ox]}\exp\left(-\frac{\alpha nF}{RT}\eta\right) + \frac{[Red(x=0)]}{[Red]}\exp\left(\frac{(1-\alpha)nF}{RT}\eta\right) \right\} \quad (8)$$

where [Ox (x=0)] and [Red (x=0)] are surface activities of the reacting material and of the product material, respectively. Both of these are given by applying the initial condition and boundary condition to the following equations (9) and (10) representing the ion diffusion rate;

$$i = -D_{el}\frac{d}{dx}C(x,t) \quad (9)$$

$$\frac{\partial C(x,t)}{\partial t} = D_{el}\frac{\partial^2 C(x,t)}{\partial x^2} \quad (10)$$

where parameters C(x, t) and $D_{el}$ are ion concentration and diffusion coefficient in a place x in the electrode at a time t, respectively. Temperature dependency of the diffusion coefficient $D_{el}$ is given by the following equation (11);

$$D_{el}(T) = D_{el}(T=293)\exp\left[\frac{E_{diff}}{R}\left(\frac{1}{293} - \frac{1}{T}\right)\right] \quad (11)$$

where parameter $E_{diff}$ is the activation energy involved in ion diffusion in the electrode.

In the above description of $R_{ohm}$, the ion conduction model of the ionic conductor is given simply in terms of the ion conductivity. However, the ion conduction model of the ionic conductor may be represented by the following equation (12) including the migration term due to a potential gradient;

$$i = -D_i\frac{d}{dx}C_i(x,t) - \frac{z_iF}{RT}D_iC_i(x,t)\frac{d}{dx}\phi(x,t) \quad (12)$$

where parameters $D_i$, $C_i(x, t)$ and $z_i$ are the diffusion coefficient of ion i in the ionic conductor, ion concentration in place x in the ionic conductor at time t, and charge of the ion, respectively. In case the ion concentration in the ionic conductor is very low, charge and discharge characteristics under various environments can be reproduced accurately by using the equation (12).

As described above, the theoretical curve of electrical characteristics can be obtained by combining the equations (2) through (12). The equation (4) may be approximated by omitting the parameters that do not constitute the rate limiting step of the electrochemical reaction, from among $R_{ohm}$, $R_{ct}$ and $R_{mt}$.

The parameters included in the above equations vary depending on such factors as the active material constituting the electrode, the ionic conductor, ion species included in the ionic conductor and the temperature in the cell. For example, values of the parameters vary when the component materials degrade due to storage at a high temperature and repeated charge-discharge cycles. In case the component materials degrade, the components of resistance shown by the equation (4) increase. This increases the polarization from the unloaded potential, resulting in a significant change in charge-discharge characteristics.

The theoretical curve of electrical characteristic may also be obtained by other electrochemical reaction equations instead of the equations (1) through (12). Also the equations may be replaced with approximated ones. Alternatively, proper functions may be determined by fitting of the data measured in an experiment. The equations may also be replaced with equivalent circuits solved with a circuit simulator.

By comparing the theoretical curve of electrical characteristic of the electrochemical device with the measured curve of electrical characteristic, quantities that indicate the state of the electrochemical device can be determined.

The apparatus for measuring the quantities that indicate the state of the battery according to the present invention comprises the following components as shown in FIG. 2:

(a) a memory section for storing the theoretical curve of the electrical characteristic of the electrochemical device;

(b) an input section for entering measured curve of the electrical characteristic of the electrochemical device;

(c) an arithmetic operation section for comparing the theoretical curve stored in the memory with the measured curve entered through the input section; and (d) an output section for giving an output of the result of arithmetic operation from the arithmetic operation section.

The memory section may be a memory device such as serve conductor memory, memory disc and magnetic tape. The input section may be sensing devices such as a keyboard, scanner, or reading device for disc or tape medium. The arithmetic operating section may be a data processing unit in computer system. The output section may be a display, printer device, or writing device for disc or tape medium.

The theoretical and the measured curves of the electrical characteristic are not necessarily continuous. They may be a series of discrete data of the electrical characteristic.

Embodiment 1

In this embodiment, a method and an apparatus capable of measuring the properties of battery materials in initial state or in degraded state without disassembling the battery will be described.

Material properties are determined by comparing the theoretical curve with a measured curve of the battery and determining parameter values of the theoretical curve. The measured curve may be obtained in either initial state or degraded state of the battery. In order to determine the values of the parameters, the random search method (Monte Carlo method), the genetic algorithm or the sequential search method may be used. Parameters determined with these methods can be used to determine the properties of the battery materials.

The term "electrical characteristic" of the battery includes charging characteristic at a given current or voltage, current rate dependency of the charging voltage, temperature dependency of the charging voltage, discharging characteristic at a given current or voltage, current rate dependency of the discharging voltage, temperature dependency of discharging voltage and complex impedance.

The term "material properties" includes the standard potential of the electrode, temperature coefficient of the electrode standard potential, exchange current density of the electrode reaction, charge mobility coefficient of the electrode reaction, diffusion coefficient of mobile ion species, activation energy of diffusion of the mobile ion species, activation energy of the electrode reaction, ion conductivity of the electrolyte, electron mobility of the electrode, electrode thickness, electrical double layer capacity of the electrode, thermal capacity of the battery and thermal resistance between inside and outside of the battery.

The term "the standard potential of the electrode reaction" refers to all standard potentials related to the oxidation-reduction reactions of the active materials in the electrodes. The term "the electrode reaction" refers to all chemical reactions that take place on the electrode including the principal reaction (main reaction) and parasitic reactions (sub reactions). "Electrode thickness" refers to the maximum distance of a range where distribution of mobile ion species concentration due to the electrode reaction is observed. The Electrode thickness may be represented by the actual electrode thickness, diameter of agglomerated particulate of the active material, diameter of individual active material particle or crystalline grain size. "Electrical double layer capacity of the electrode" is the electrical double layer capacity generated in the interface between the active material and the liquid electrolyte. "Thermal capacity of the battery" refers to the total thermal capacity including the electrode material, the electrolyte and the battery enclosure. "The thermal resistance between the inside and the outside of the battery" is the inverse of the thermal conductivity between the inside and the outside of the battery.

Now this embodiment will be described in detail below taking the nickel-cadmium battery as an example. The nickel-cadmium battery can be represented by an equivalent circuit model shown in FIG. 3. Other battery systems such as nickel-hydrogen secondary battery and lithium ion secondary battery can also be represented by similar equivalent circuit models.

As shown in FIG. 3, the equivalent circuit consists of (i) diode D+ and D− representing the reaction resistance of each reaction in the electrode reactions (oxidation-reduction reactions on the positive and the negative electrodes, reaction of cadmium in the negative electrode, generation and absorption reactions of oxygen and hydrogen, etc.), (ii) voltage sources E+ and E−, (iii) resistance components $R_{Ni}$ and $R_{cd}$ that are the inverse of the election mobility in the electrode, (iv) electrical double layer capacity $C_{dl}$ of the positlve and the negative electrodes, and (v) ohmic resistance $R_{el}$ of the electrolyte solution.

By applying the equations (2) through (12) to a system o the nickel-cadmium battery, charge-discharge characteristic at a given current or voltage, current rate or temperature dependency of charge-discharge voltage, or complex-impedance characteristics can be determined.

Potentials of the positive and the negative electrodes of the nickel-cadmium battery under unloaded condition, namely the equilibrium potential $E_{eq}$ is derived from the equation (2) and is given by the following equation (13);

$$E_{eq}^+ = E_{NiOOH/Ni(OH)2}^0 + \frac{RT}{nF} \ln \frac{Q_{Ni}}{Q_{Ni,max} - Q_{Ni}} \tag{13}$$

where $Q_{Ni}$ is the amount of charge charged in the positive electrode, and $Q_{NiMax}$ is the maximum charge quantity in the positive electrode.

Temperature dependency of $E^0_{NiOOH/Ni(OH)2}$ is given by the equation (3).

Potentials of the positive and the negative electrodes under loaded condition are obtained from the equations (4) through (8). In this battery system, it can be assumed that diffusion of the mobile ion species (proton) in the positive electrode active material is the rate limiting step of the battery reaction. Loaded potential is given by the equation (14);

$$I = I_0(t)\left\{\frac{a_{red}(0, t)}{a_{red}(t)}\exp\left(\frac{\alpha F}{RT}\eta(t)\right) - \frac{a_{ox}(0, t)}{a_{Ox}(t)}\exp\left(-\frac{(1-\alpha)F}{RT}\eta(t)\right)\right\} \tag{14}$$

where $I_0(t)$ is the exchange current of the electrode and $a_{red}(0, t)$ and $a_{red}(t)$ are the activity of the active material under reducing condition on the electrode surface and inside the electrode, respectively. $a_{ox}(0, t)$ and $a_{ox}(t)$ are the activity of the active material under oxidizing condition on the electrode surface and inside the electrode, respectively. $\alpha$ is the charge mobility coefficient.

Among these, the reaction current $I_{Ni}$ flowing in the direction of the arrow in FIG. 3 is given by equation (15);

$$I_{Ni} = \tag{15}$$

$$I_{0,Ni}\left\{\frac{Q_{Ni,\max} - Q_s(t)}{Q_{Ni,\max} - Q_{Ni}(t)}\exp\left(-\frac{\alpha nF}{RT}\eta(t)\right) - \frac{Q_s(t)}{Q_{Ni}(t)}\exp\left(-\frac{(1-\alpha)nF}{RT}\eta(t)\right)\right\}$$

where $Q_S$ is the quantity of charge on the electrode surface.

The proton diffusion in the positive electrode active material follows equations (9) through (11).

Further, quantity of heat generated in the battery by reactions in the battery is given by equation (16);

$$q = \sum_j I_j \frac{-T\Delta S_j}{nF} + \sum_j I_j \eta_j + I^2 R_{int} \tag{16}$$

where $I_j$ is the reaction current and $\Delta S_j$ is entropy. $R_{int}$ is the internal resistance of the battery.

Now the relationship between the parameters and the charging and discharging characteristics will be described.

The standard potential becomes the reference for the absolute value of the battery voltage of the charging and discharging curves. Consequently, changes in the equilibrium potentials of the positive and the negative electrodes result in the changes in the battery voltage itself. Also because the standard potential is dependent on the temperature, it is a factor for determining the temperature dependency of the battery voltage.

The exchange current density relates to the reactivity of the active materials in the positive and the negative electrodes. The exchange current density also determines the rising sharpness of the charging and discharging curves.

The charge mobility coefficient determines the reactivity of the battery reaction at the electrode, and particularly determines the difference in reactivity between the oxidization reaction and the reducing reaction.

In the battery system used in this embodiment, diffusion of protons is the rate limiting step of the reaction. The diffusion coefficient contributes to the change in the internal impedance during heavy current charging or discharging. Therefore, this value is determined particularly by the charging or discharging rates. The diffusion coefficient used at this time is dependent on the temperature, and the temperature dependency is determined by the activation energy of diffusion of the protons.

The battery reactions taking place on the positive and the negative electrodes are also dependent on the temperature. Parameters that determine the temperature dependency are the levels of activation energy of the positive and the negative electrodes reaction.

Electrical resistance of the ionic conductor is represented by the inverse of the ion conductivity, and gives the ohmic resistance of the battery. Values of electrical resistance of the positive and the negative electrodes are inverse of the electron conductivity of the electrodes, and also give the ohmic resistance components of the battery.

Thickness of the positive electrode gives the boundary condition of diffusion of the mobile ion species in the electrode reaction. This thickness influences the diffusion process of the mobile ion species in the electrode reaction described previously. That is, this thickness has an influence on the charging and discharging rates of the battery.

The electrical double layer capacity of the positive and the negative electrodes have close relationships to the waveforms during pulse charging or pulse discharging of the battery.

Thermal capacity of the battery determines the relationship between the quantity of heat generated in the battery and the rate of temperature rise. Thermal resistance component between the inside and the outside of the battery determines the influence of the outside temperature on the temperature change in the battery. Consequently, these parameters affect the progress of the reactions in the battery. This relationship is expressed as the equation (17), where Wbat is thermal capacity of the battery. $\Delta T$ denotes the change in battery temperature.

$$\frac{dq}{dt} = W_{bat}\Delta T \tag{17}$$

These parameters are determined from the measured values of battery characteristics by using the random search method, the sequential search method and the genetic algorithm. With the random search method, the values of parameters are set using random numbers, and the parameters are substituted in the equation (model) that represents the battery characteristics. With the sequential search method, the values are determined in advance as the initial values, and such a set of parameters that minimizes the difference from the measured characteristic values are searched while gradually changing the values of the parameters. With the genetic algorithm, such a set of parameters that minimizes the difference from the measured characteristic values are searched by selecting a set of predetermined number of parameters in advance and exchanging parameters in a process called crossover among the parameters, or giving changes called mutation to the parameter values.

The apparatus for measuring the material characteristics of the battery according to this embodiment comprises the following components as shown in FIG. 2;

(a) the memory section for storing the theoretical curve of the electrical characteristics of the battery;

(b) the input section for entering measured data of the electrical characteristics of the battery;

(c) the arithmetic operation section for comparing the theoretical curve stored in the memory with the measured data entered through the input section; and (d) the output section for giving an output of the result of arithmetic operation from the arithmetic operation section.

The data memory section stores the equations representing the battery characteristics that include parameters representing the properties of the battery materials. When measured characteristic values of the battery are entered through the input section, the arithmetic operation section determines the values of the equation parameters that give the same characteristics as the measured one. Based on the values of parameters that have been determined, the material characteristic of the battery are output from the output section.

EXAMPLE 1

As the first example of this embodiment, the battery characteristics described above were analyzed with a method that combines the random search method and the sequential search method. Charging and discharging curves with current of 300 mA and 600 mA at temperatures of 0° C. and 20° C. were determined using equations employing the parameters of the standard potentials of the positive and the negative electrodes, temperature coefficient of the standard potentials of the positive and the negative electrodes, exchange current density of the positive electrode, charge mobility coefficient of the positive electrodes diffusion coefficient of the active material in the positive electrode, activation energy of diffusion of the active material, activation energy of positive electrode reaction, electrical resistance of the electrolyte, electrical resistance of the positive and the negative electrodes, thickness of the positive electrode, electrical double layer capacity of the positive and the negative electrodes, thermal capacity of the battery and thermal resistance between the inside and the outside of the battery.

Figure 4:
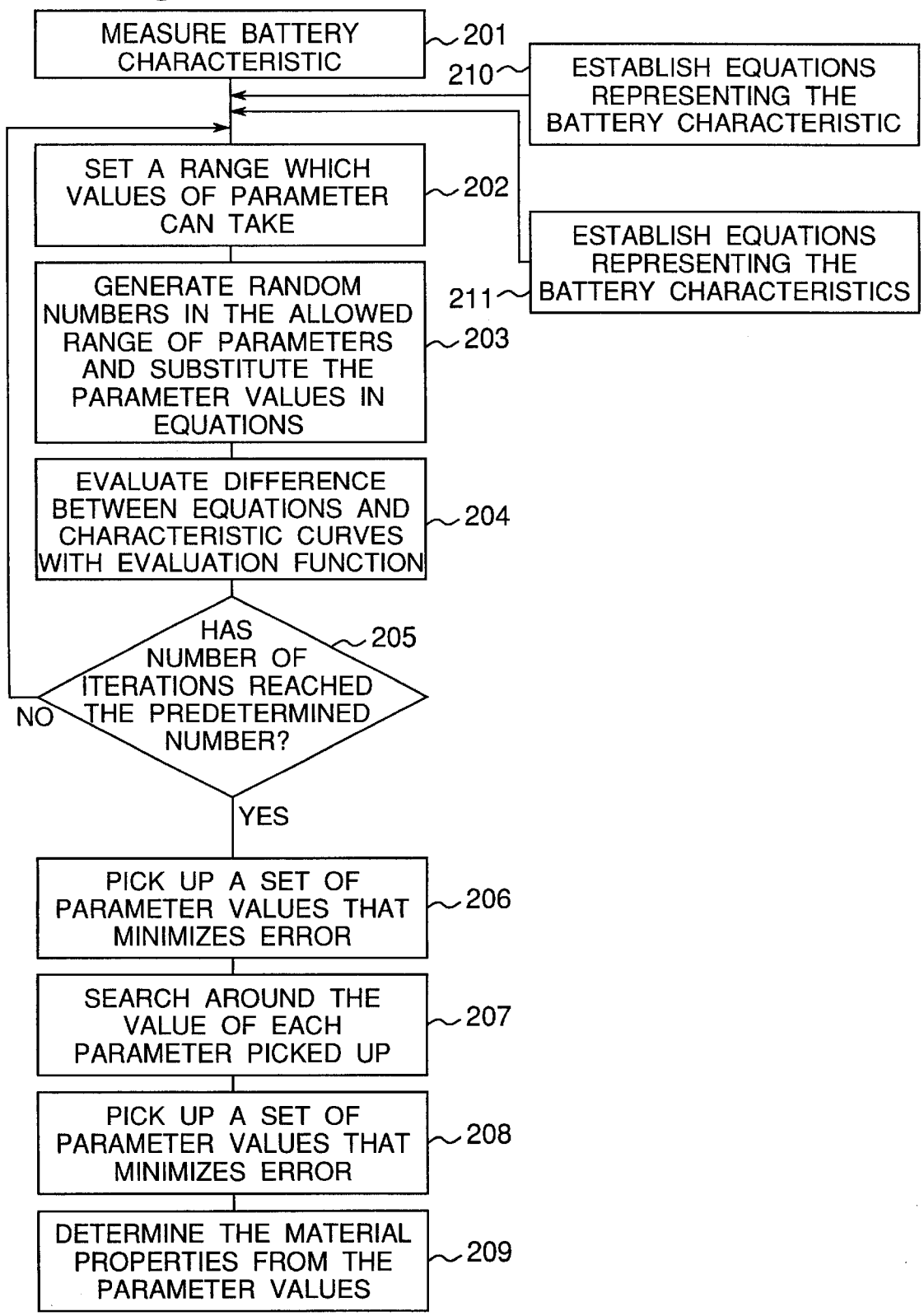
FIG. 4 is a flow chart showing the measuring method in example 1 of the present invention.

Procedure of analysis in this example is shown in the flow chart of FIG. 4. Configuration of the analysis apparatus is shown in FIG. 2. First, the charging curve and discharging curve of the battery to be analyzed were measured (step 201).

After repeating these operations a predetermined number of times (10,000 times in this example) (step 205), one parameter set that gave the least errors was selected (step 206), and values around selected set of parameters were substituted sequentially with the sequential search method (step 207). As a result, parameters which minimize the evaluation function value were picked up (step 208), and the characteristic values of the materials constituting the battery were determined based on these values (step 209). The characteristic values are output from the output section 2.

The parameters of the equivalent circuit model obtained in this embodiment are shown in Table 1.

TABLE 1

| Parameters used in equations representing the battery characteristics (characteristic values of the battery materials): $E_p^0$ | Calculated value |
|---|---|
| Standard potential of Ni electrode: $E_p^0$ | 0.520 |
| Standard potential of Cd electrode: $E_n^0$ | 0.808 |
| Temperature coefficient of Ni electrode standard potential: $k_p$ | $-1.35 \times 10^{-3}$ |
| Temperature coefficient of Cd electrode standard potential: $k_{pn}$ | $1.06 \times 10^{-3}$ |
| Exchange current of Ni electrode: $I_o(t)$ | $1.0 \times 10^{-3}$ |
| Charge transfer coefficient of Ni electrode: $\alpha$ | 100.0 |
| Diffusion coefficient of active material in Ni electrode: $D(T)$ | $5.0 \times 10^{-14}$ |
| Activation energy of diffusion of active material in Ni electrode: $\Delta E^{diff}$ | $9.62 \times 10^3$ |
| Activation energy of Ni electrode reation: $\Delta E$ | $4.0 \times 10^4$ |
| Electrical resistance of electrolyte solution: $R_{el}$ | 0.1 |
| Electrical resistance of Ni electrode: $R_p$ | 0.05 |
| Electrical resistnace of Cd electrode: $R_n$ | 0.03 |
| Ni electrode thickness: x | $5.5 \times 10^{-6}$ |
| Electrical double layer capacity of Ni electrode: $C_p$ | 0.2 |
| Electrical double layer capacity of Cd electrode: $C_n$ | 0.2 |
| Thermal capacity of battery: $W_{bat}$ | 14 |
| Thermal resistance between inside and outside of battery: $R_{bat}$ | 50 |

An allowed value range of parameter was determined and entered is through the input section 1 (step 202).

Random numbers in the determined range were generated in the arithmetic operation section 4 thereby to generate a set of parameters. The parameters were substituted in the equation (battery operation model) that represents the charging and discharging curves which have been stored in the memory section 3 in step 210 (step 203).

In the arithmetic operation section 4, the set of parameters was substituted in the equation to calculate the charging curve and discharging curve. In the arithmetic operation section 4, the differences between the calculated values and the values obtained from the measured charging and discharging curves (hereinafter called the errors) were calculated by using an evaluation function that has been established in step 211 (step 204). In order to make objective evaluation of the difference between the measured curve and the theoretical curve, the evaluation function expressed as in the equation (18) was used;

$$H(x) = \sum_i \{f_i(x) - g_i(x)\} + \sum_i \left\{ \frac{\partial f_i(x)}{\partial x} - \frac{\partial g_i(x)}{x} \right\} \quad (18)$$

where $f_i(x)$ is the measured value of the battery characteristic and $g_i(x)$ is the corresponding value calculated. x is an independent variable such as time or the amount of charge. i denotes a sampling point of the variable. In this example, 100 sampling points were taken in the charging and discharging voltage curve.

The values of the parameters shown in Table 1 have close relationship to the material characteristics of this battery system as described above. The values of parameters thus obtained provide the accurate characteristic values of the battery materials, within the limitation of the accuracy of the battery model. Similar results can also be obtained by using complex impedance characteristics instead of the charge and discharge curves.

EXAMPLE 2

Figure 5:
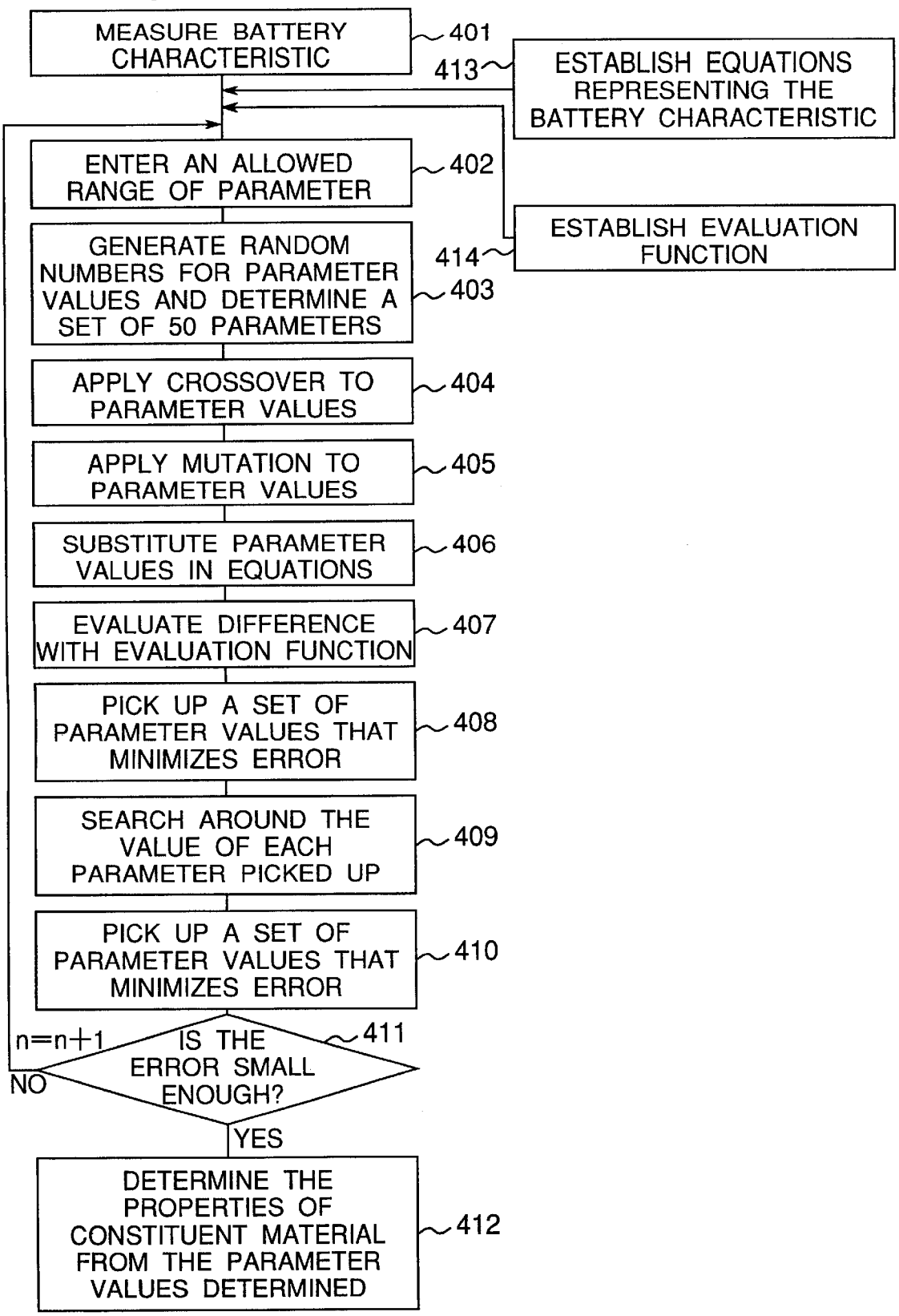
FIG. 5 is a flow chart showing the measuring method in example 2.

As the second example, the genetic algorithm and the sequential search method were combined as a method of determining the parameter values by using the parameters and battery characteristics similar to those of the first example. Procedure of analysis is shown in the flow chart of FIG. 5. The apparatus used in this example is similar to that in example 1.

First, charging and discharging curves of the battery to be analyzed were measured (step 401). An allowed range of each parameter value was determined by taking reference to literature, and was entered through the input section 1 of the apparatus (step 402). In the arithmetic operation section 4, random numbers were generated within the predetermined range, and 50 sets of parameters were determined solely from the random numbers. In the case of n≧2, 49 sets were determined from random numbers and one set was taken from the parameters showing the least errors on the previous results of the arithmetic operation, thereby establishing 50 sets of parameters (step 403). In the arithmetic operation section 4, crossover (step 404) and mutation (step 405) were applied to the parameter sets (Masatoshi Sakawa and Masahiro Tanaka "Genetic algorithm" edited by Japan Fuzzy Engineering Association; Software Computing Series, published by Asakura Shoten). The sets of parameters thus obtained were substituted in the equation (battery operation model) that represents the charging and discharging curves, to calculate the charging and discharging curves (step 406). The charge and discharge with current of 300 mA and 600 mA at temperatures of 0° C. and 20° C. were calculated in this example. In the arithmetic operation section 4, the differences between the calculated values and the measured curves were calculated by using the evaluation function represented by the equation (18) established in step 414 (step 407).

After repeating these operations 10 times, a set of parameters that gave the least errors was selected, and values around the value of each parameter of the set were substituted sequentially by the sequential search method (step 407). As a result, parameter values that showed the least errors were taken (step 410). The error was compared with the predetermined value (step 411) and, when the error was less than the predetermined value, it was determined treat the set of parameters was the optimum solution (step 412).

Optimum values of parameters obtained in this example are shown in Table 2. The sequential search method is essentially same with the local search and hill-climbing methods.

TABLE 2

| Parameters used in equations representing the battery characteristics (characteristic values of the battery materials): $E_p^0$ | Calculated value |
| --- | --- |
| Standard potential of Ni electrode: $E_p^0$ | 0.520 |
| Standard potential of Cd electrode: $E_n^0$ | 0.808 |
| Temperature coefficient of Ni electrode standard potential: $k_p$ | $-1.35 \times 10^{-3}$ |
| Temperature coefficient of Cd electrode standard potential: $k_{pn}$ | $1.06 \times 10^{-3}$ |
| Exchange current of Ni electrode: $I_o(t)$ | $1.0 \times 10^{-3}$ |
| Charge transfer coefficient of Ni electrode: $\alpha$ | 100.0 |
| Diffusion coefficient of active material in Ni electrode: $D(T)$ | $5.0 \times 10^{-14}$ |
| Activation energy of diffusion of active material in Ni electrode: $\Delta E^{diff}$ | $9.62 \times 10^3$ |
| Activation energy of Ni electrode reation: $\Delta E$ | $4.0 \times 10^4$ |
| Electrical resistance of electrolyte solution: $R_{el}$ | 0.1 |
| Electrical resistance of Ni electrode: $R_p$ | 0.05 |
| Electrical resistnace of Cd electrode: $R_n$ | 0.03 |
| Ni electrode thickness: x | $5.5 \times 10^{-6}$ |
| Electrical double layer capacity of Ni electrode: $C_p$ | 0.2 |
| Electrical double layer capacity of Cd electrode: $C_n$ | 0.2 |
| Thermal capacity of battery: $W_{bat}$ | 14 |
| Thermal resistance between inside and outside of battery: $R_{bat}$ | 50 |

The values of the parameters shown in Table 2 have close relationship to the material characteristics of this battery system as described above. The values of parameters thus obtained provide the accurate characteristic values of the battery materials within the limitation of the accuracy of this battery model. Similar results can also be obtained by using complex impedance characteristics for the battery characteristics.

Embodiment 2

In this embodiment, a method and an apparatus for measuring the remaining discharge or charge capacity of the battery will be described.

In order to efficiently and fully utilize the energy stored in the battery, it is necessary to have exact knowledge of the electrochemical reaction (principal reaction and parasitic reactions) that take place in the battery during charge and discharge operations and to understand the conditions of the battery during use.

Measuring the remaining capacity of charge/discharge of the battery is especially important to avoid over-discharge and overcharge. In the case of quick charging of a battery, in particular, it is important to correctly measure the remaining capacity.

After the battery has been stored at a high temperature or repetitively experienced charge and discharge cycles, the battery may not show the normal charge/discharge characteristics due to progress of degradation through self-discharge, irreversible phase transition reaction of the electrode active materials, decomposition of the ionic conductor, generation of gas and other parasitic reactions. Thus it is necessary to exactly know how much degradation will be caused in the battery and how the charge-discharge curve will change, by the repetition of charge and discharge cycles, and storage at high temperatures. In order to predict the charge/discharge characteristics of the battery after storage at a high temperature or charge/discharge cycles, it is important to know how the electrode potential changes due to the degradation, and how ion transportation and electron transportation in the electrode and ion transportation in the ionic conductor change under loaded condition. Use of battery without exact knowledge about the charge and discharge characteristics after storage or cycles, the parasitic reactions and the degradation will be accelerated.

Now preferred examples of this embodiment will be described in detail below.

EXAMPLE 3

In this example, a measuring method with a homogeneous single-phase reaction as the principal reaction is described.

In the case of homogeneous single-phase reaction, the potential model of electrode under unloaded condition of the equation (2), for example, is represented by the following equation (19). $C^*_{ox}$ and $C^*_{red}$ are concentrations of the reacting material and the product material under unloaded condition, respectively, that are related as $C^*_{ox}+C^*_{red}=C^*$. The equation (8) can be transformed to the following equation (20). Thus $C^*_{red}$ is given by the equation (21).

$$E_{eq} = E_0 + \frac{RT}{nF}\ln\frac{c^*_{Ox}}{c^*_{Red}} = E_0 + \frac{RT}{nF}\ln\frac{c^*_{Ox}}{c^* - c^*_{Ox}} \quad (19)$$

$$i = i_0\left\{-\frac{c_{Ox}(0,t)}{c^*_{Ox}}\exp\left(-\frac{\alpha nF}{RT}\eta\right) + \frac{c_{Red}(0,t)}{c - c^*_{Ox}}\exp\left(\frac{(1-\alpha)nF}{RT}\eta\right)\right\} \quad (20)$$

-continued $$c_{Red}(x, t) = c_0 - \frac{D_{el}}{x_L}\int_0^t g(t)dt - \frac{2D_{el}}{x_L}\sum_{n=1}^{\infty}\int_0^t \exp\left[\left(-\frac{D_{el}\pi^2 n^2}{x_L^2}\right)(t-s)\right]g(s)ds\cos\pi\frac{nx}{x_L} \quad (21)$$

$g(t)=i/(nFAD\phi_{el})$, and $C_{ox}(0, t)$ and $C_{red}(0, t)$ are concentrations of the reacting material. and the product material on the electrode surface at a given time t, respectively. $C_{ox}(0, t)$ and $C_{red}(0, t)$ can be determined by setting the initial condition and boundary condition to the equations (9) and (10). A and $x_L$ are geometrical area and apparent thickness of the electrode, respectively. Particle size of the reacting material, for example, is employed for $x_L$.

Solving the equations (19) through (21) gives the values of the electrode potential $E_{eq}$, reaction resistance $R_{ct}$ that represents the principal reaction taking place in the interface between the electrode and the ionic conductor, and the resistance $R_{mt}$ of the electrode against ion transportation. With these parameters and $R_{ohm}$, which represents the resistance against the electron transfer in the electrode and ion transfer in the ionic conductor, theoretical curve of the charge and discharge characteristics of the electrode in homogeneous single-phase reaction can be obtained.

The method described above was applied to the nickel electrode. The nickel electrode employs nickel hydroxide as the active material and is widely used for the positive electrode material of the nickel-hydrogen storage battery, the nickel-cadmium battery and the like. Aqueous solution of KOH was used as the ionic conductor or electrolyte solution. Principal reaction in the nickel electrode is represented by the equation (22).

$$NiOOH + xe^- xH^+ \leftrightarrow Ni(OH_x)OH \quad (22)$$

In this reaction, mobile ion species is proton and the reaction of the nickel hydroxide is a homogeneous single-phase reaction that depends on the proton concentration. The homogeneous single-phase reaction refers to a reaction wherein the active materials involved in the electrochemical reaction are mixed uniformly to the atomic level such as in a solid solution.

Based on the equations described above, charge and discharge curves of the nickel electrode at 20° C. and 1 atm were calculated and compared with the measured charge and discharge curves. The results are shown in FIG. 6 and FIG. 7.

Figure 6:
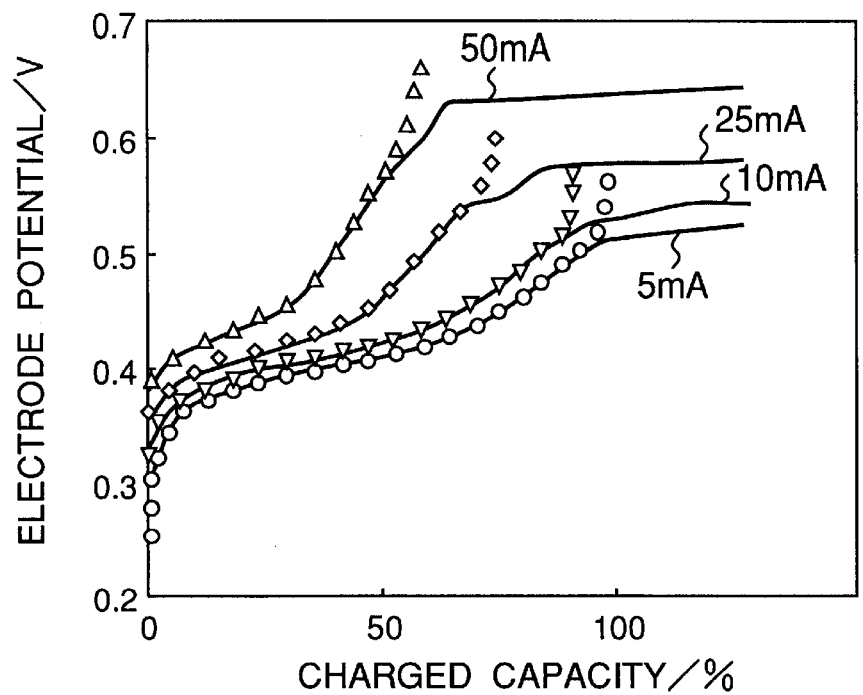
FIG. 6 is a graph showing measured data and theoretical data of charging curve for a half cell in example 3.

FIG. 6 shows the charging curve measured when a half cell comprising a nickel electrode and aqueous solution of KOH was charged to 125% of the theoretical capacity with constant currents of 5 mA, 10 mA, 25 mA and 50 mA FIG. 6 also shows the calculated values by the equations (4), (19), (20) and (21) plotted on the measured curve. In FIG. 6, the solid line represents measured values while Δ and other marks show the values calculated. Calculation was done by using the parameters and physical constants shown in Table 3 and the equations approximated by expanding them into series of up to second order terms.

Figure 7:
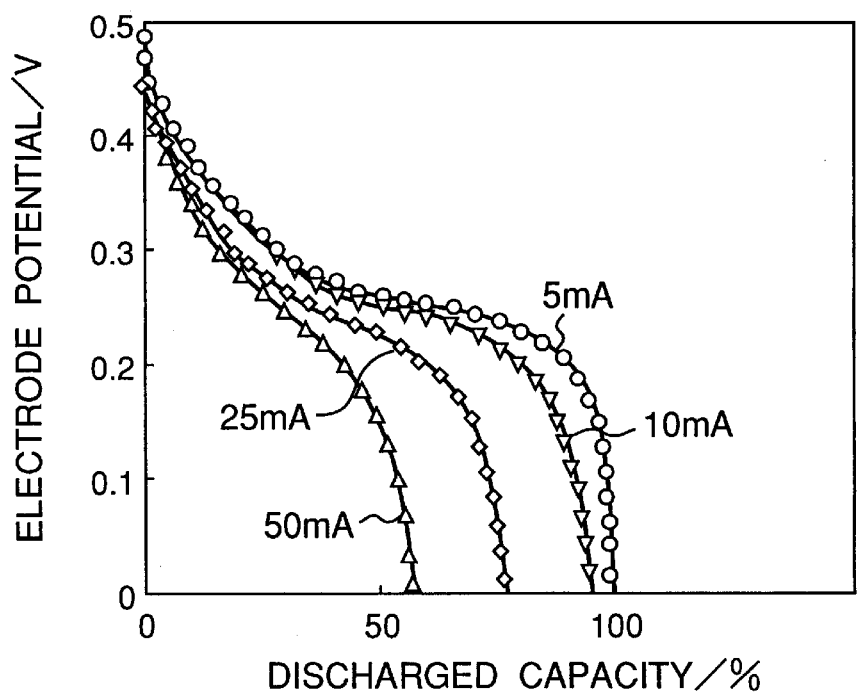
FIG. 7 is a graph showing measured data and theoretical data of discharging curve for the half cell in example 3.

FIG. 7 shows the discharge curve measured when the same half cell was discharged till the potential difference from a mercury electrode used as the reference electrode dropped to 0V with constant currents of 5 mA, 10 mA, 25 mA and 50 mA, with values calculated similarly to the above plotted thereon.

TABLE 3

| Parameters and physical constants | Value |
| --- | --- |
| Standard potential of Ni electrode principal reaction: $E_0$ [V] | 0.35 |
| Temperature coefficient of Eo: dE/dT [V/K] | −0.0014 |
| Exchange current density of Ni electrode principal reaction: $i_0$ [A/m$^2$] | 0.01 |
| Resistance of Ni electrode: $R_{ohm}$ [Ω] | 0.05 |
| Resistance of aqueous solution of KOH: $R_{ohm}$ [Ω] | 0.2 |
| Activation energy of Ni electrode principal reaction: $E_a$ [J/mol] | 30000 |
| Charge transfer coefficient of Ni electrode principal reaction: α | 0.5 |
| Diffusion coefficient of protons in Ni electrode: $D_{el}$ [m$^2$/sec] | $5 \times 10^{-13}$ |
| Activation energy of diffusion of protons in Ni electrode: $E_{diff}$ [J/mol] | 20000 |
| Surface area of Ni electrode: A [m$^2$/g] | 4 |
| Thickness of Ni electrode: $x_L$ [m] | $5.5 \times 10^{-6}$ |
| Standard potential of Cd electrode principal reaction: $E_0$ [V] | −0.91 |
| Interaction term of Cd electrode principal reaction: W [J] | 10000 |
| Temperature coefficient of Eo: dE/dT [V/K] | −0.001 |
| Exchange current density of Cd electrode principal reaction: $i_0$ [A/m$^2$] | 100 |
| Activation energy of Cd electrode principal reaction: [J/mol] | 30000 |
| Charge trnasfer coefficient of Cd electrode principal reaction | 0.5 |
| Diffusion coefficient of hydroxide ion in Cd electrode: $D_1$ [m$^2$/sec] | $1 \times 10^{-14}$ |
| Diffusion coefficient of hydroxide ion in Cd electrode: $D_2$ [m$^2$/sec] | $1 \times 10^{-13}$ |
| Activation energy of diffusion of hydroxide ion in Cd electrode: $E_1$ and $E_2$ | 20000 |
| Surface area of Cd electrode: A [m$^2$/g] | 4 |
| Thickness of Cd electrode: $x_{L\,[m]}$ | $1 \times 10^{-5}$ |
| Standard potential of oxygen generating reaction on Ni electrode: $E_0$ [V] | 0.3 |
| Temperature coefficient of El: dE/dT [V/K] | $1.5 \times 10^{-3}$ |
| Solubility coefficient of oxygen into aqueous solution of KOH: $K_5$ [Pa · m$^3$/mol] | $2 \times 10^{-6}$ |
| Charge transfer coefficient of oxygen generating reaction on Ni electrode: α | 0.5 |
| Exchange current density of oxygen generating reaction on Ni electrode: $i_0$ [A/m$^2$] | $1 \times 10^{-8}$ |
| Volume of battery: [m$^3$] | $1.5 \times 10^{-6}$ |
| Thermal conductivity coefficient: [W/m$^2$/K] | 0.3 |
| Concentration of aqueous solution of KOH: [mol/m$^3$] | 8000 |
| Diffusion coefficient of protons in aqueous solution of KOH [m$^2$/sec] | $1 \times 10^{-10}$ |

TABLE 3-continued

| Parameters and physical constants | Value |
|---|---|
| Gas constant: R [J/mol] | 8.314 |
| Ambient temperature: T [K] | 293 |
| Faraday constant: F [C/mol] | 96500 |

From FIG. 6, it can be seen that, in the case of charging reaction, calculation and measurement are in good agreement till near the end of the charging period regardless of the charging rate. On the other hand, in the case of discharging reaction, as shown in FIG. 7, calculation and measurement are in good agreement till the discharge completes. Thus accurate theoretical curve of the charge-discharge characteristics of the electrode can be obtained by employing the model described above.

When reaction rate of parasitic reactions are very small, as is the case in this example, the remaining charge or discharge capacity of the Ni electrode directly depends on $C^*_{ox}$ or $C^*_{red}$ which are concentrations of NiOOH and Ni(OH)$_x$OH. $C^*_{ox}$ and $C^*_{red}$ are related as $C^*_{ox}+C^*_{red}=C^*$, wherein $C^*$ is a maximum capacity of this electrode.

For example, the remaining percentage of the discharge capacity of the Ni electrode is obtained by $(C^*_{ox}-C^*_{ox,min})/(C^*_{ox,max}-C^*_{ox,min})$ wherein $C^*_{ox,min}$ and $C^*_{ox,max}$ are the concentrations in full-discharge and full-charge state, respectively. $C^*_{ox}$ and $C^*_{red}$ are determined from the measured discharge curve using the random search method, the sequential search method, the genetic algorithm or the combination thereof, as described in Embodiment 1. The remaining percentage of the charge capacity electrode may be evaluated similarly.

Thus the remaining charge or discharge capacities of the Ni electrode is accurately evaluated from a measured and theoretical discharge curve. The remaining charge or discharge capacity of the Cd electrode is evaluated in a similar way. The remaining battery capacity is evaluated as the lesser of the remaining capacities of the positive and the negative electrodes.

The apparatus for measuring the remaining capacity of the battery according to this embodiment comprises the following components as shown in FIG. 2:

(a) the memory section for storing the theoretical curve of the charge and discharge curves of the battery;

(b) the input section for entering measured data of the charge and discharge curves of the battery;

(c) the arithmetic operation section for comparing the theoretical curve stored in the memory with the measured data entered through the input section; and (d) the output section for giving an output of the result of arithmetic operation from the arithmetic operation section.

The data storing section stores the equations representing the theoretical curves of the battery charging and discharging characteristics. When measured values of the battery charging and discharging characteristics are entered through the input section, remaining capacity of the battery is given from the output section.

EXAMPLE 4

In this example, the principal reaction represented by the equation (1) involves a homogeneous multi-phase reaction. In the case the principal reaction involves phase transition in a two-phase coexisting reaction, for example, the potential model under unloaded condition of the equation (2) is represented by the following equation (23). The homogeneous multi-phase reaction refers to a case where two or more phases exist in the same active material.

$$E_{eq} = E^0 + \frac{W}{nF}\left(1 - 2\frac{c^*_{Ox}}{c^*}\right) + \frac{RT}{nF}\ln\frac{c^*_{Ox}}{c^* - c^*_{OX}} \quad (23)$$

Parmeter W is a term of interaction between the reacting material and the product material.

When W<2RT, the reaction may be regarded as a homogeneous single-phase reaction. However, when W>2RT, phase transition is involved and therefore the function of $c^*_{os}/c^*$ has the following three regions:

1) $0<c<c^*_{ox,1}$;

2) $c^*_{ox,1}<c<c^*_{ox,2}$; and

3) $c^*_{ox}<c<c^*$.

Regions 1) and 3) are homogeneous single-phase reaction regions, and region 2) is a region where two phases coexist and phase transition is involved. $c^*_{ox,1}$ and $c^*_{ox,2}$ are derived from the following equation (24).

$$E^0 + \frac{W}{nF}\left(1 - 2\frac{c^*_{Ox}}{c^*}\right) + \frac{RT}{nF}\ln\frac{c^*_{Ox}}{c^* - c^*_{OX}} = 0 \quad (24)$$

When the principal reaction involves phase transition, since only the proportion of the two phases changes, electrode potential $E_{eq}$ under unloaded condition remains $E_0$ in the range of $c^*_{ox,1}<c<c^*_{ox,2}$. Similarly the equation (14) is written as the following equation (25) when phase transition is involved.

$$i = i_{0,phase}\left\{-\frac{c_{Ox}(0,t)}{c^*_{Ox}}\exp\left(-\frac{\alpha nF}{RT}\eta\right) + \frac{c_{Red}(0,t)}{c - c^*_{Ox}}\exp\left(\frac{(1-\alpha)nF}{RT}\eta\right)\right\} \quad (25)$$

Similarly to the case of the electrode potential under unloaded condition, the value of exchange current density, too, does not change in the region of $c^*_{ox,1}<c<c^*_{ox,2}$. Although the concentration on the electrode surface in the regions of $0<c<c^*_{ox,1}$ and $c^*_{ox,1}<c<c^*$ can be derived by a method similar to that of the first example. However, in the region $c^*_{ox,1}<c<c^*_{ox,2}$ where phase transition occurs, it is necessary to determine the concentration on th( electrode surface from an equation that includes migration in the interface between phases. $c_{ox}(0, t)$ and $c_{Red}(0, t)$ can be determined from the equation (9) and (10) under the conditions given by the equations (26), (27) and (28).

Initial condition $c_{Red}(x,0)=c_0$ (26)

Boundary condition $c(0,t)=c_{Red}(0,t)$ $c(\delta-0,t)=c_{Red,2}(\delta<0,t)$ $c(\delta+0,t)=c_{Red}(\delta+0,t)$ (27)

$$[c_{Red,2}(\delta - 0, t) - c_{Red}(\delta + 0, t)]d\delta(x) = \quad (28)$$

$$\left\{-D_2\left(\frac{\partial C(x,t)}{\partial x}\right)_{\delta-0} + D_1\left(\frac{\partial C(x,t)}{\partial x}\right)_{\delta+0}\right\}dt$$

δ is the distance from the electrode surface to the interface between phases. Concentration on the first phase side of the phase boundary and concentration on the second phase side are related by the equation (28). In the present description, concentration on the second phase side is used for the concentration on the electrode surface.

As described above, $E_{eq}$, $R_{ct}$ and $R_{mt}$ can be determined by using the equations (24) through (28). With these parameters and $R_{ohm}$, which is sum of the electrode resistance and resistance of the ionic conductor against ion transportation to these, charge and discharge operation can be reproduced. When the interaction term W has a very large value, in particular, the homogeneous single-phase reaction region diminishes since the principal reaction involves phase transition in the region of $0<c<c^*$. Therefore, it is sufficient to use the equation for the region of $c^*_{ox,1}<c<c^*_{ox,2}$ only. For example, this applies to an electrode made of metal lithium, metal cadmium or zinc metal, wherein an electrode reaction can be described only by the principal reaction accompanied by dissolution and precipitation.

Also in case the principal reaction involves homogeneous single-phase reaction and homogeneous multi-phase reaction, the principal reaction can be reproduced by dividing the principal reaction into the elementary reactions and using the respective models described above.

A case of cadmium electrode will be described below as an example. Cadmium is widely used as active material for a negative electrode in the nickel-cadmium storage battery. Aqueous solution of KOH is used as the ionic conductor or electrolyte of the nickel-cadmium battery. Principal reaction of the cadmium electrode is a two-phases-coexisting reaction wherein phase transition of cadmium hydroxide and metal cadmium occurs as shown by the equation (29);

$$Cd(OH)_2 + 2e^- \leftrightarrow Cd + 2OH^- \quad (29)$$

Based on the equations described above, charge/discharge curves of a half cell using the cadmium electrode at 20° C. and 1 atm were calculated and compared with the measured charge/discharge curves. The results are shown in FIG. 8 and FIG. 9.

Figure 8:
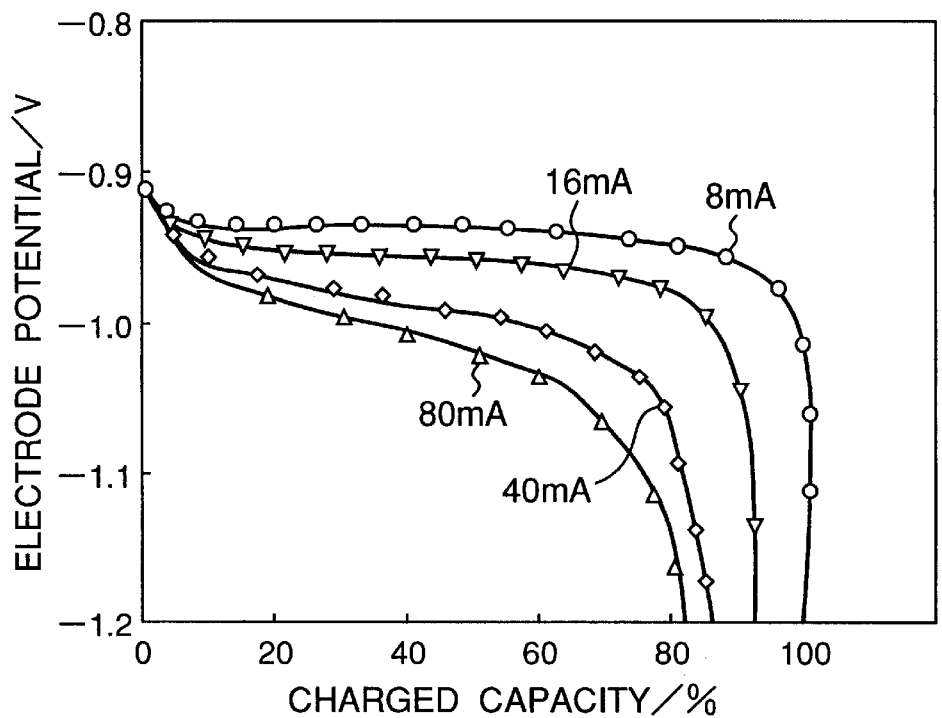
FIG. 8 is a graph showing measured data and theoretical data of charging curve for the half cell in example 4.

FIG. 8 shows the charging curve measured when a half cell was charged to −1.2V with respect to a mercury reference electrode with constant currents of 8 mA, 16 mA, 40 mA and 80 mA. FIG. 8 also shows values calculated by the equations (4) and (23) through (29) plotted on the measured curve. Calculation was done with the parameters and physical constants shown in Table 1. The equations approximated by expanding them into series of up to second order terms.

Figure 9:
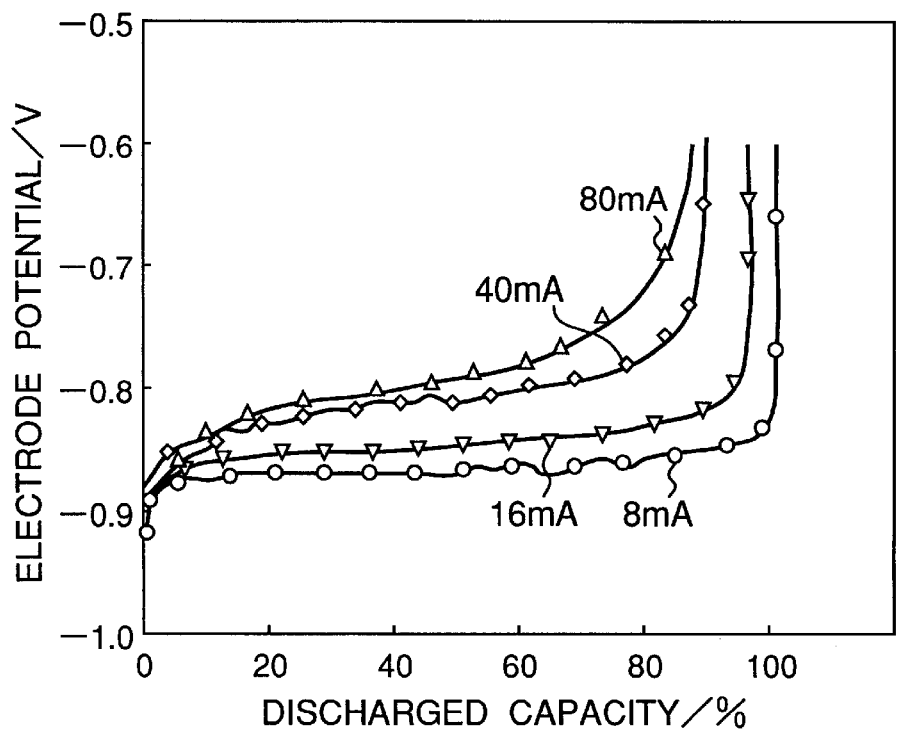
FIG. 9 is a graph showing measured data and theoretical data of discharging curve for the half cell in example 4.

FIG. 9 shows the discharge curve measured when the same half cell was discharged till the voltage dropped to −0.6V with respect to the mercury reference electrode with constant currents of 8 mA, 16 mA, 40 mA and 80 mA, with values calculated similarly to the above plotted thereon.

From FIG. 8 and FIG. 9, it can be seen that calculation and measurement are in very good agreement regardless of the difference in the charging and discharging rates. Thus it is shown that the charge/discharge operations of the electrode can be reproduced from the set of models described above.

The remaining charge or discharge capacity of the Cd electrode directly depends on $C^*_{ox}$ or $C^*_{red}$ which are concentrations of $Cd(OH)_2$ and Cd.

For example, the remaining percentage of the discharge capacity of the Cd electrode is obtained by $(C^*_{red}<C^*_{red,min})/(C^*_{red,min})$ wherein $C^*_{red,min}$ and $C^*_{red,max}$ are the concentrations in full-discharge and full-charge state, respectively. $C^*_{ox}$ and $C^*_{red}$ are determined from the measured discharge curve using the random search method, the sequential search method, the genetic algorithm or the combination thereof, as described in Embodiment 1.

Thus, the remaining battery capacity is accurately evaluated from the measured and theoretical charge/discharge curve, even in a case the principal electrode reaction involves a homogeneous multi-phase reaction.

EXAMPLE 5

Now measurement method of a case, where parasitic reactions taking place in a positive electrode, a negative electrode or an ionic conductor are involved besides the principal reaction, will be described below.

Degradation of a battery due to storage at a high temperature or repeated cycles of discharge and charge is heavily influenced by parasitic reactions, and it is very important to investigate how various components of resistance change. In the nickel electrode, for example, the principal reaction is accompanied by parasitic reactions such as the oxygen generating reaction that occurs when overcharged, hydrogen generating reaction that occurs when over-discharged, self-discharging reaction that is conspicuous when the battery is stored under fully charged condition, memory effect that occurs when discharge of the battery is interrupted with a sufficient energy left unused and is then charged, and inactivation that accompanies an irreversible phase transition of the active material of the nickel electrode during charge and discharge.

In this example, oxygen generating reaction that occurs when overcharged, in particular, will be discussed.

The oxygen generating reaction is represented by the following equation (30).

$$4OH^- \leftrightarrow 2H_2O + O_2 + 4e^- \quad (30)$$

The oxygen generating reaction that occurs when overcharged is represented by the potential model under unloaded condition such as the equation (2) and the polarization potential under loaded condition, as the following equations (31) and (32).

$$E_{eq} = E_0 + \frac{RT}{nF}\ln[O_2] = E_0 + \frac{RT}{nF}\ln K_s P_{O_2} \quad (31)$$

$$i_j = i_0 \exp\left(\frac{\alpha nF}{RT}\eta\right) \quad (32)$$

Activation of the oxygen molecules generated in this process is represented by a constant $K_S$ of oxygen solubility into KOH solution and the partial pressure of oxygen $P_{O2}$. $i_j$ is the proportion of current used in the oxygen generating reaction to the total current. The oxygen generating reaction occurs depending on the degree of polarization, and the amount of hydroxide ions consumed in the ionic conductor can be estimated from the current flown. Thus the values of parameters of the ion transportation phenomenon represented by the equation (12) or (4) change significantly, leading to a change in the portion of polarization of the electrochemical reaction.

In addition to the principal reaction of the nickel electrode used in the third example, a charging curve that accompanies the electrochemical reaction described above at 20° C. and 1 atm was calculated and compared with the measured charging curve. The result is shown in FIG. 10.

Figure 10:
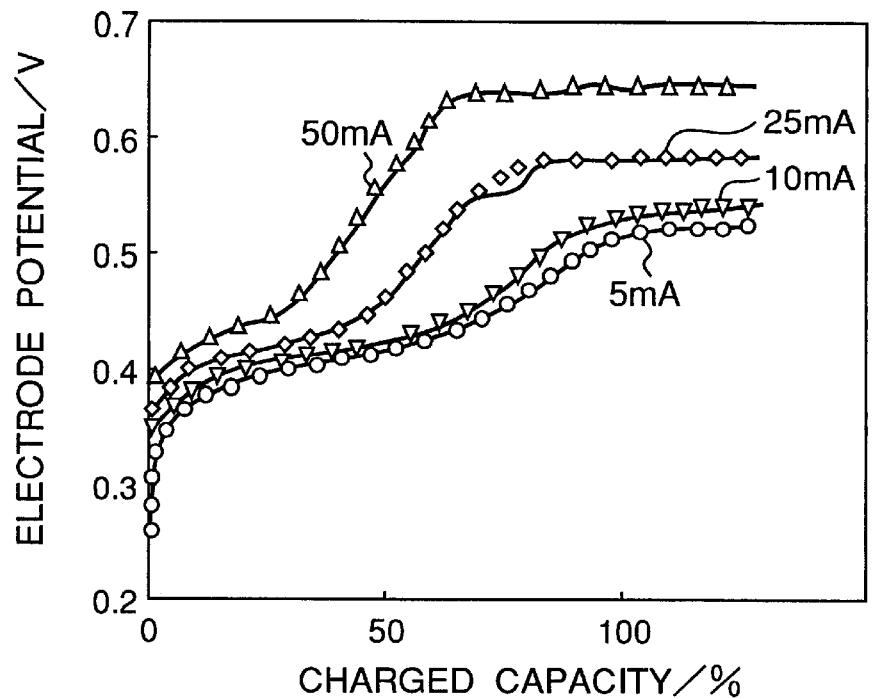
FIG. 10 is a graph showing measured data and theoretical data of charging curve for the half cell in example 5.

FIG. 10 shows the charging curve measured when a half cell comprising a nickel electrode was charged to 125% of the capacity with constant currents of 5 mA, 10 mA, 25 mA and 50 mA, with values calculated by the equations (4), (19) through (21), (31) and (32) and using the parameters and physical constants shown in Table 1 plotted thereon. Calculation was done by using the equations approximated by expanding them into series of up to second order terms.

From FIG. 10, it can be seen that, due to the parasitic reaction of oxygen generating reaction taken into consideration as well as the principal reaction, calculation and measurement are in very good agreement till the last stage of charging. Thus it can be seen that the charging operation of the electrode including the parasitic reaction can be reproduced from the charge/discharge operations described above.

Therefore, the remaining capacity of the Ni electrode can be measured more accurately than in the Example 3. The method for evaluating the remaining capacity is same as that in Example 3.

While the equations (4), (19) through (21), (31) and (32) are used for the reproduction of the charge/discharge operations in this example, other electrochemical or chemical equations may also be used.

In case the battery is stored at a high temperature and cycled for many times, in addition to the oxygen generating reaction, other models for the parasitic reactions may be used; the hydrogen generating reaction; self-discharging reaction; the memory effect; and inactivation that accompanies an irreversible phase transition of the active material of the nickel electrode.

According to this example, since the level of overvoltage at which the parasitic reaction takes place is known, it is also possible to control the charging and discharging conditions to prevent degradation of battery materials due to the parasitic reactions and efficiently utilize the electrode.

EXAMPLE 6

In this example, such a measurement method will be described that takes into account the pressure change in the battery as a parasitic reaction occurring in the electrodes or in the ionic conductor.

Gas is often generated in a battery due to a parasitic reaction caused by storage at a high temperature and repetition of charge and discharge cycles. Because the battery is hermetically sealed, the generated gas cannot get out of the battery and remains inside, thus increasing the pressure in the battery. It is important to know the influence of the increased pressure for evaluating the remaining capacity of battery and utilizing the battery efficiently.

In the nickel electrode, parasitic reactions that occur besides the principal reaction include; the oxygen generating reaction that occurs when overcharged; self-discharging reaction that is conspicuous when the battery is near fully-charged, memory effect and inactivation that accompanies an irreversible phase transition of the active material of the nickel electrode. Major parasitic reaction that generates gas is the oxygen generating reaction. The oxygen generating reaction is represented by the following equation (33) as shown in the fifth example.

$$4OH^- \leftrightarrow 2H_2O + O_2 + 4e^- \quad (33)$$

The oxygen generating reaction that occurs with overcharge is described by the equation (31) that represents the potential $E_{eq}$ under unloaded condition and the equation (32) that represents the polarization potential $\eta$ under loaded condition. Partial pressure of oxygen $P_{O_2}$ is given by the following equation (34);

$$P_{O_2} = \frac{m_{O_2} RT}{V} \quad (34)$$

where $m_{O_2}$ is the mole number of oxygen generated, and V is the volume of the battery. This shows to what extent the pressure in the battery increases due to the generated oxygen and how it contributes to the oxygen generating reaction during overcharge.

Now specific description will be made below by taking the nickel-cadmium battery as an example. The nickel-cadmium battery is a secondary battery that employs a nickel electrode including nickel hydroxide as the positive electrode, cadmium electrode including cadmium hydroxide as the negative electrode and aqueous solution of KOH as the ionic conductor or electrolyte. Reactions taking place on the nickel electrode include the electrochemical reaction (principal reaction) described in the third example and the fifth example and the oxygen generating reaction and other parasitic reactions. On the other hand, the principal reaction taking place on the cadmium electrode is a reaction under coexistence of two phases that involves phase transition of the cadmium hydroxide and metal cadmium, and therefore can be represented by an equation of multi-phase electrode reaction accompanied by the phase transition. Because all of these reactions take place inside the battery, $E_{eq}$, $R_{el}$ and $R_{mt}$ of each electrode and the electrode resistance $R_{ohm}$ can be determined similarly to the third example and the fourth example. For the ionic conductor, the resistance of the ionic conductor against ion transportation is considered. The oxygen generating reaction that is one of the parasitic reactions shown in the fifth example was included in the investigation.

Based on the equations described above, charging curve of the nickel-cadmium battery at 20° C. and 1 atm was calculated and compared with the measured charging curve. The results are shown in FIG. 11.

Figure 11:
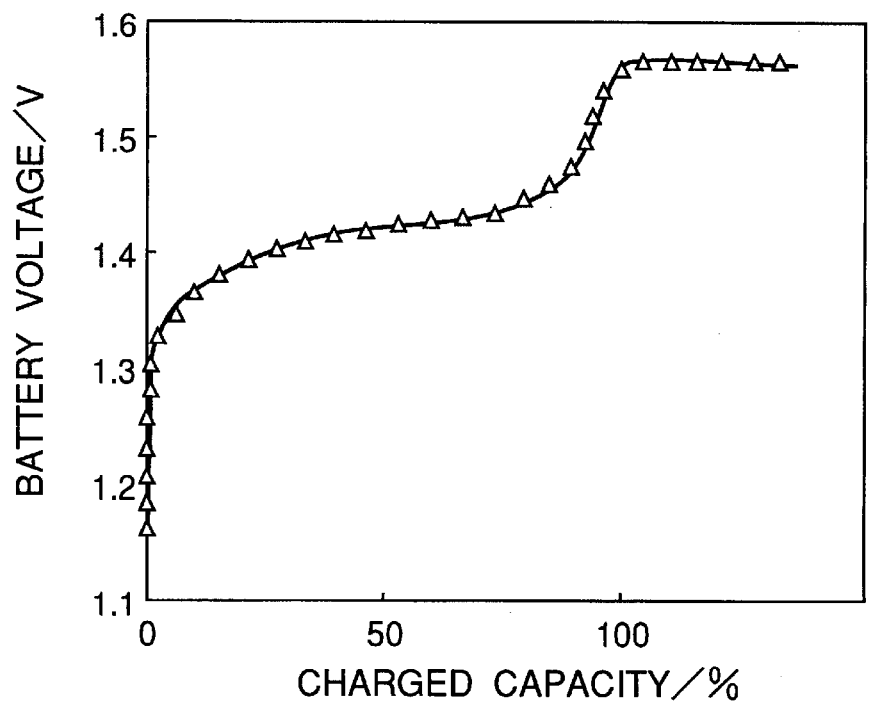
FIG. 11 is a graph showing measured data and theoretical data of charging curve for the half cell in example 6.

FIG. 11 shows the charging curve measured when a nickel-cadmium battery was charged to 125% of the theoretical capacity with a constant current of 80 mA. FIG. 11 also shows the values calculated by the equations (4), (12), (19) through (21), (23) through (28) and (31) through (34) plotted on the measured curve. Calculation was done by using the parameters and physical constants shown in Table 3 and the equations approximated by expanding them into series of up to second order terms.

From FIG. 11, it can be seen that the calculation and the measurement are in very good agreement. Thus it is shown that the charging operation of the electrode including the parasitic reactions can be reproduced.

In the case of the nickel-cadmium storage battery used in this example, the battery capacity is restricted by the Ni electrode. Therefore, remaining capacity of the battery during charge or discharge can be measured from $C^*_{ox}$ and $C^*_{Red}$ of the Ni electrode as can be seen from the third, fourth and fifth examples.

According to this example, since the level of overvoltage, at which the parasitic reaction takes place is known, it is also possible to control the charging and discharging conditions to prevent degradation of battery materials due to the parasitic reactions and efficiently utilize the electrode.

While the .equations (4), (12), (19) through (21), (23) through (28) and (31) through (34) are used in this example, other equations may also be used.

When storage at a high temperature and charge and discharge cycles are taken into consideration, in addition to the oxygen generating reaction of the nickel electrode, equations representing other parasitic reactions may be used; the hydrogen generating reaction of the nickel electrode; the self-discharging reaction of the nickel electrode; the memory effect of the nickel electrode; the inactivation that accompanies an irreversible phase transition of the active material of the nickel electrode; the oxygen generating reaction of the cadmium electrode; the hydrogen generating reaction and dendorite generating reaction on the surface of the cadmium electrode.

EXAMPLE 7

In this example, a measurement method will be described for charge/discharge operations that involve (i) reaction heat generated in the electrochemical reaction taking place in the interface between the ionic conductor and the electrode, (ii) energy loss during electrochemical reaction, and (iii) temperature change due to energy loss during ion transportation in the ionic conductor, electron transportation in the electrode and electron transportation in the electrode. Temperature in the battery may change depending not only on the ambient temperature but also on the principal reaction and/or the parasitic reactions taking place therein. When the ambient temperature is low, in particular, temperature in the battery changes greatly during charging and discharging. Heat generated in the battery is given as the sum of (i) chemical reaction heat due to the principal reaction and the parasitic reactions taking place in the battery, (ii) Joule heat given by the product of the reaction current and polarization voltage, and (iii) Joule heat given by the product of the in, internal resistance and the current flowing in the battery.

$$q = \sum_{j=1}^{n} -\frac{i_j T \Delta S}{n_j F} + \sum_{j=1}^{n} i_j \eta + i^2 R_{ohm} \quad (35)$$

where $i_j$ is the proportion of current consumed in the electrode reaction or each parasitic reaction and $\Delta S$ is a change in entropy.

Heat conductivity is generally given by the thermal conductivity equation (36) shown below.

$$\Phi = \alpha A (T_{bat} - T_{amb}) \quad (36)$$

where $\alpha$ is thermal conductivity coefficient. $T_{bat}$ is the temperature in the battery and $T_{amb}$ is the ambient temperature. This equation shows how the heat generated in the battery is dissipated to the outside of the battery. Therefore, the temperature change in the battery can be evaluated.

In the description that follows, the nickel-cadmium battery will be taken as an example.

The principal reaction of the nickel electrode is represented by the equation (22) of the third example, and the cadmium electrode is represented by the equation (29) of the fourth example. Since these principal reactions occur in the battery, resistance of the ionic conductor given by the equation (12) is taken into account. The oxygen generating reaction was also taken into account as a parasitic reaction as in the case of the fifth example and the sixth example.

Based on the equations described above, charging curve of the nickel-cadmium battery at 1 atm was calculated and compared with the measured charging curve. The results are shown in FIG. 12 and FIG. 13.

Figure 12:
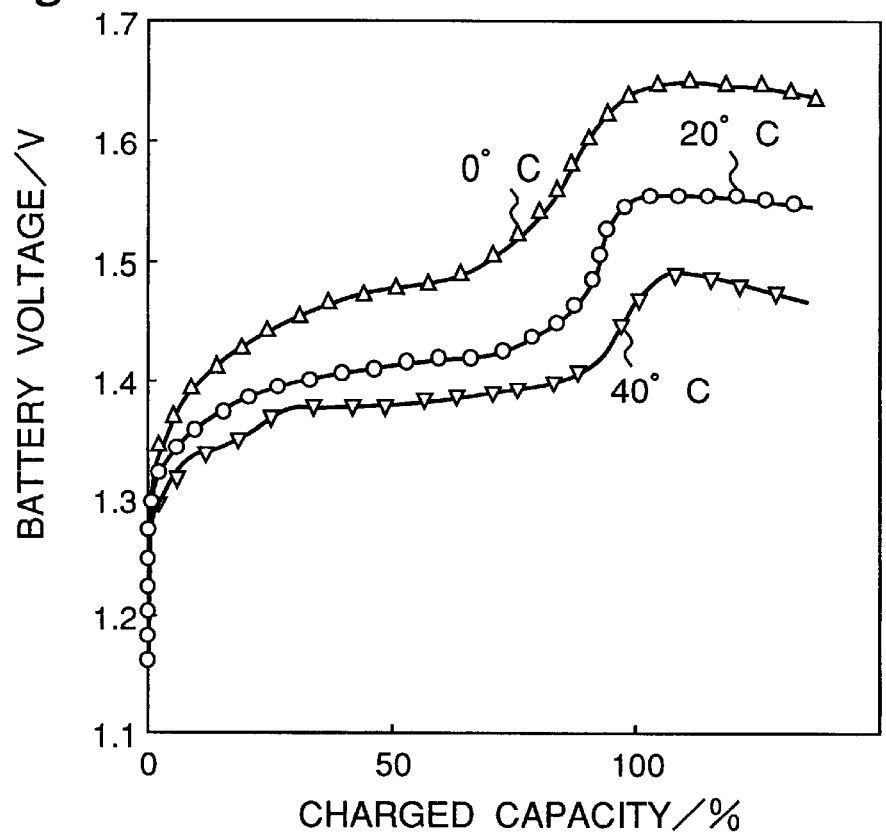
FIG. 12 is a graph showing measured data and theoretical data of charging curve for the half cell in example 7.

FIG. 12 shows the measured charging curve when the nickel-cadmium battery was charged to 125% of the theoretical capacity with a constant current of 80 mA at, ambient temperatures of 0° C., 20° C. and 40° C. The values calculated by the equations (4), (12), (19) through (21), (23) through (28) and (31) through (35) are plotted on the measured curve. FIG. 13 shows the discharge curve measured when the nickel-cadmium battery was discharged till the battery voltage dropped to 0.9V with a constant current of 80 mA at similar ambient temperatures, with values calculated with these equations plotted thereon. Calculation was done by using the parameters and physical constants shown in Table 1 and the equations approximated by expanding them into series of up to second order terms.

Figure 13:
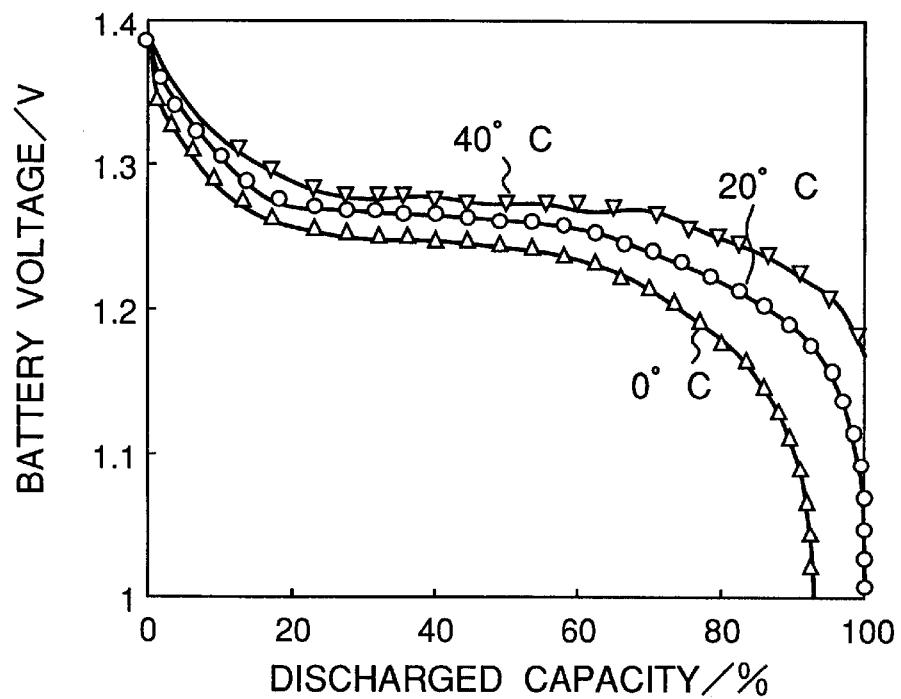
FIG. 13 is a graph showing measured data and theoretical data of discharging curve for the half cell in example 7.
Figure 14:
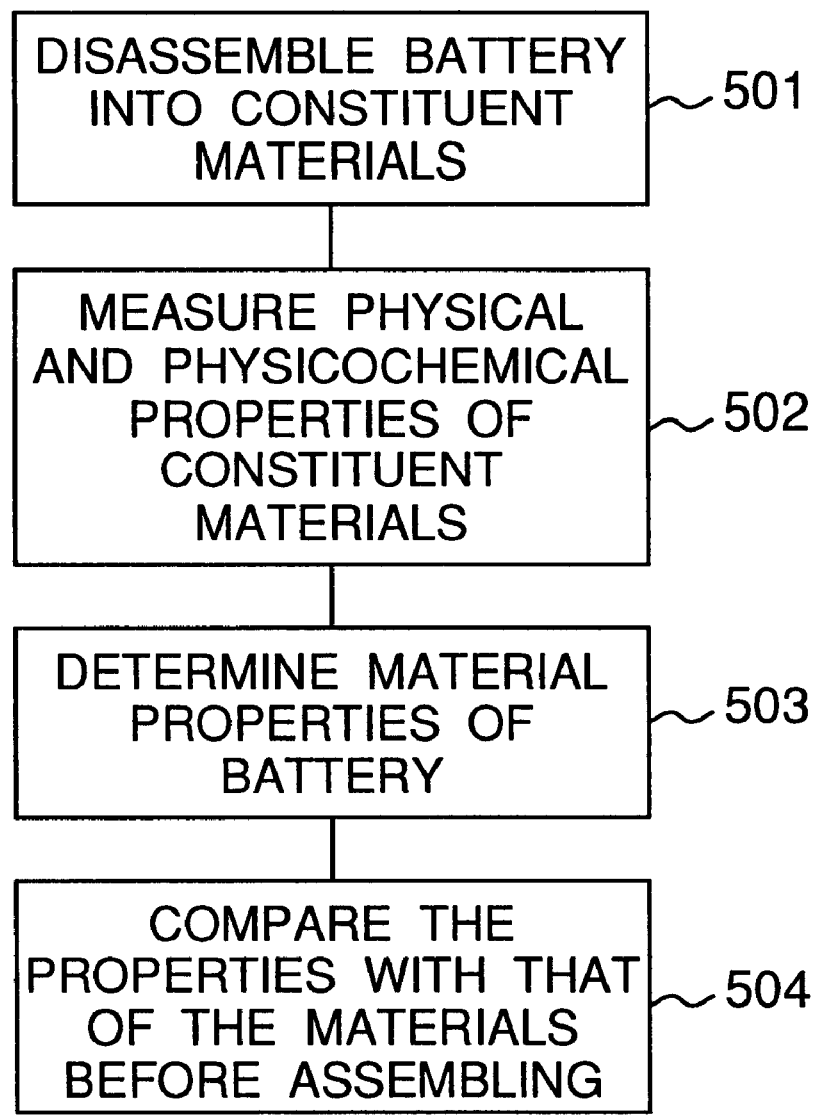
FIG. 14 is a flow chart showing a conventional method of measuring material properties of a cell.

From FIG. 12 and FIG. 13, it can be seen that calculation and measurement are in very good agreement at any of the ambient temperatures. Thus it can be seen that the charge/discharge operations of the electrode can be reproduced from the set of models described above.

In the case of the nickel-cadmium storage battery used in this example, since the capacity is restricted by the Ni electrode, the remaining capacity of the battery during charge or discharge can be measured similarly to the third through the sixth examples.

According to this example, since the level of overvoltage at which the parasitic reaction takes place is known, it is also possible to control the charging and discharging conditions to prevent degradation of battery materials due to the parasitic reactions and efficiently utilize the electrode.

While the equations described in this example are preferable to reproduce the charge and discharge operations, other equations of electrode reactions may also be used.

Although all the measured curves shown in FIGS. 6 through 13 are continuous, discretely measured data on charge and discharge operation are also acceptable to compare with the theoretical data.

Moreover, although the, charge and discharged operations are represented by nonlinear simultaneous equations in above examples, such methods are also effective as; replacing the equations with approximated ones; finding proper functions for representing the experimental results by fitting; directly using the experimental results; and replacing the equations with equivalent circuits and solving them with a circuit simulator.

The present invention has been fully described by way of preferred embodiments while making reference to the accompanying drawings, but it will be apparent for those skilled in the art, that various variations and modifications can, be made. It should be understood that such variations and modifications within the scope of the present invention defined by the appended claims are part of the present invention.

What is claimed is:

1. A method of detecting properties and state of charge of a battery that has electrodes and an ionic conductor by comparing
   (a) a series of theoretical data of an electrical characteristic of the battery, obtained by combining at least one of an electron transportation model of the electrode, an ion transportation model of the electrode, an ion conduction model of the ionic conductor, and a model of an electrochemical reaction taking place in an interface between the electrode and the ionic conductor, with a potential model of the electrode, with
   (b) a series of measured data of the electrical characteristic of the battery;
      wherein the electrical characteristic is at least one selected from a group of charging characteristic, current rate dependency of charging voltage, temperature dependency of charging voltage, discharging characteristic, current rate dependency of discharging voltage, temperature dependency of discharging voltage, and complex impedance;

wherein the property of the battery is a property of material that constitutes the battery, parameters of the theoretical data are determined so that the theoretical data approximates the measured data, and the property of the material is determined from the parameters.

2. The measuring method according to claim 1, wherein at least one selected from a group of random search method, genetic algorithm, and sequential search method is used as a method of determining the parameters of the theoretical data.

3. The measuring method according to claim 1, wherein the property of material is at least one selected from a group of standard potential of electrode, temperature coefficient of electrode standard potential, exchange current density of electrode reaction, charge transfer coefficient of electrode reaction, diffusion coefficient of mobile ion species, activation energy of diffusion of mobile ion species, activation energy of electrode reaction, ion conductivity of electrolyte, electron conductivity of the electrode, electrode thickness, electrical double layer capacity of the electrode, thermal capacity of the battery and thermal resistance component between inside and outside of the battery.

4. The measuring method according to claim 1, wherein the electrical characteristic is at least one selected from a charge curve and a discharge curve of the battery.

5. The measuring method according to claim 1, wherein input parameters for the ion transportation model include at least one of ion diffusion coefficient and ion concentration in the ionic conductor.

6. The measuring method according to claim 1, wherein input parameters for the electron transportation model include electron conductivity of the electrode.

7. The measuring method according to claim 1, wherein input parameters for the ion transportation model include at least one of ion diffusion coefficient and ion concentration in the electrode.

8. The measuring method according to claim 1, wherein input parameters for the model of electrochemical reaction include exchange current density of the electrochemical reaction.

9. The measuring method according to claim 1, wherein the electron transportation model and the ion transportation model are models that represent a homogeneous multi-phase reaction of the electrode.

10. The measuring method according to claim 1, wherein the model of an electrochemical reaction includes a model that represents parasitic reaction of the electrode.

11. The measuring method according to claim 1, wherein at least one of the electron transportation model, the ion transportation model, the ion conduction model, the model of an electrochemical reaction, and the potential model includes a model of temperature change in the battery, and the model of temperature change comprises at least one selected from a group of; heat generated in the electrochemical reaction; energy loss that accompanies the electrochemical reaction; energy loss that accompanies ion transportation in the ionic conductor; energy loss that accompanies ion transportation in the electrode; and energy loss that accompanies electron transportation.

12. An apparatus for detecting properties and state of charge of a battery by using a method according to claim 1, wherein the battery has electrodes and an ionic conductor, said apparatus comprising:

(a) a memory section for storing a series of theoretical data of an electrical characteristic of the battery obtained by combining at least one of an electron transportation model of the electrode, an ion transportation model of the electrode, an ion conduction model of the ionic conductor, and a model of the electrochemical reaction taking place in an interface between the electrode and the ionic conductor, with a potential model of the electrode;

(b) an input section for entering a series of measured data of the electrical characteristic of the battery;

(c) an arithmetic operation section for comparing the theoretical data stored in said memory section with the measured data entered through said input section; and (d) an output section for giving an output of a result of arithmetic operation from said arithmetic operation section.

* * * * *